(12) United States Patent
Katznelson

(10) Patent No.: US 7,898,257 B2
(45) Date of Patent: Mar. 1, 2011

(54) OPEN YOKE MAGNET ASSEMBLY

(75) Inventor: Ehud Katznelson, Ramat Yishai (IL)

(73) Assignee: Aspect Magnet Technologies, Ltd., Moshav Ben Shemen (IL)

(*) Notice: Subject to any disclaimer, the term of this patent is extended or adjusted under 35 U.S.C. 154(b) by 715 days.

(21) Appl. No.: 11/832,650

(22) Filed: Aug. 2, 2007

(65) Prior Publication Data

US 2010/0001729 A1 Jan. 7, 2010

Related U.S. Application Data

(60) Provisional application No. 60/821,179, filed on Aug. 2, 2006.

(51) Int. Cl.
*G01V 3/00* (2006.01)

(52) U.S. Cl. .......................... 324/319; 324/320; 335/296

(58) Field of Classification Search .................. 324/319, 324/320; 335/296–306
See application file for complete search history.

(56) References Cited

U.S. PATENT DOCUMENTS

| | | | | |
|---|---|---|---|---|
| 4,672,346 A | * | 6/1987 | Miyamoto et al. | 335/296 |
| 4,818,966 A | * | 4/1989 | Miyamoto et al. | 335/296 |
| 5,107,239 A | * | 4/1992 | Abele | 335/306 |
| 5,289,152 A | * | 2/1994 | Oguriyama et al. | 335/302 |
| 6,150,911 A | * | 11/2000 | Katznelson et al. | 335/299 |

* cited by examiner

*Primary Examiner* — Louis M Arana

(74) *Attorney, Agent, or Firm* — Michael David, Esq.; Whiteford, Taylor & Preston, LLP

(57) ABSTRACT

An open yoke MRI apparatus has a set of permanent magnets arranged at the inner surfaces of the yoke and spaced apart from one another. A set of annular permanent magnets is included in each magnet arrangement, including a set with trapezoidal cross-sections to provide a more uniform field and to allow greater access to a patient placed within the magnetic field.

15 Claims, 6 Drawing Sheets

OPEN YOKE MAGNET ASSEMBLY

PRIORITY

This application claims priority from U.S. Patent Application No. 60/821,179, filed on Aug. 2, 2006 and which is incorporated herein by reference.

FIELD OF THE INVENTION

This invention relates to permanent magnet assemblies for use in medical applications and particularly to permanent magnet assemblies having an open ferromagnetic yoke for use in magnetic resonance imaging (MRI), magnetic resonance therapy (MRT) and interventional magnetic resonance imaging (iMRI).

BACKGROUND OF THE INVENTION

The principles of MRI are set forth in several patents such as U.S. Pat. No. 5,304,933, which is incorporated herein by reference. iMRT, sometimes referred to as interventional MRI or intraoperative MRI, is the performance of an interventional medical procedure on a patient in an MRI system. During the procedure, a surgical instrument is inserted into a patient in order to perform the procedure at a predetermined site in the body. The iMRI system is used in this case to monitor in quasi real-time the correct placement of the instrument and also to observe the nature and the extent of the effect of the intervention on the tissue.

In an MRI and/or iMRI system a strong uniform magnetic field is required in order to align an objects nuclear spins along the z-axis of a Cartesian coordinate system having mutually orthogonal x-y-z axes. The required strong uniform magnetic field, used for full body imaging, is normally in the order of 0.1 to 2 Tesla. The image quality and the accuracy of an MRI and/or iMRI system are dependent on the degree of uniformity of the strong uniform magnetic field. Uniformity is critical in MRI and/or iMRI applications because if the strong uniform magnetic field is not properly uniform within the volume of interest, the desired discrimination between different elements, due to the finely controlled magnetic field gradient, will be subject to misinterpretation. Typically, the uniformity required for the strong uniform magnetic field is within the order of 10 ppm or 0.1 Gauss within the volume of interest. It is essential for iMRI systems used in interventional procedures to be based on an open structure, so as to provide the physician easy access to the intervention site. Presently, most MRI systems employ a large magnet, which effectively surrounds the whole body of the patient, to produce the strong uniform magnetic field. Such magnets are usually large superconductor resistive or permanent magnets, each of which is expensive and heavy. Further, the access to the patient in these cases is obstructed.

Attempts have been made to provide open magnets for interventional procedures by employing two spaced-apart Helmholtz superconductive coil assemblies. They provide only limited space between the assemblies allowing for constricted access by only one person, such as a surgeon. Moreover, they are large, massive, immobile and expensive. See U.S. Pat. No. 5,410,287 to Laskaris et al., and U.S. Pat. No. 5,428,292 to Dorri et al.

U.S. Pat. No. 4,875,485 to Matsutani discloses an apparently more compact configuration, based on a pair of spaced-apart superconductive Helmholtz coil assemblies, arranged for movement relative to a platform carrying the patient. The access to the patient remains restricted in this case as well, due to the additional space occupied by the cryostat. Also, the movement of the coils independently of one another is impractical, because the superconducting properties of the coils require extreme precision in positioning of the two poles, in the absence of which the magnetic system quenches.

In comparison to superconductive systems, permanent magnets are less expensive, generate only a minimal unwanted fringe field and are not involved with liquefied gas handling or vacuum requirements. Open access MRI systems based on permanent magnets have been disclosed by U.S. Pat. No. 4,829,252 to Kaufman and U.S. Pat. No. 5,134,374 to Breneman. Both are using a pair of opposing magnetic flat circular poles, employed one above the other, with the patient lying down between the magnets. The poles are mounted on end plates, supported by connecting members, which provide return paths for the magnetic flux. These systems are massive and immobile and the access to the patient is encumbered by the supporting structure.

A pair of opposing permanent magnet assemblies for use in MRI, each made of concentric magnetic rings, composed of a set of magnetic polygonal blocks, is disclosed in U.S. Pat. No. 5,332,971 to Aubert. Aubert teaches that the opposing concentric rings within each of the pairs of permanent magnets are to be spaced apart from each other the same distance. The magnet is massive, weighing about 3 tons and is therefore not amenable to movement relative to a patient's body.

In each of the above prior art magnets, used for providing the large uniform magnetic field for MRI and/or iMRI applications, the magnetic field is generated in a first stage as uniformly as possible. More uniformity is achieved subsequently by shimming.

U.S. Pat. No. 5,900,793 to Katznelson et al., discloses permanent magnet assemblies for use in medical applications, he assemblies consist of a plurality of annular concentric magnets spaced-apart along their axis of symmetry.

U.S. Pat. No. 6,150,911 to Katznelson et al., discloses yoked permanent magnets for use in medical applications. particularly permanent magnets for use in magnetic resonance imaging (MRI), magnetic resonance therapy (MRT), and interventional magnetic resonance imaging (iMRI). Two sets of opposing permanent magnet assemblies, leaving open access to a part or organ of a patient's body, consist of a plurality of coaxial concentric permanent magnets. The magnets within each of the assemblies may be spaced-apart along their common axis of symmetry and may be tilted with respect to the common axis of symmetry. The magnets include an open yoke made from a ferromagnetic material for increasing the magnetic field strength within the imaging volume by providing a path for closing magnetic flux lines of the opposing permanent magnet assemblies.

U.S. patent application to Panfil and Katznelson, Ser. No. 09/295,814, entitled A METHOD FOR DESIGNING OPEN MAGNETS AND OPEN MAGNETIC APPARATUS FOR USE IN MRI/iMRI PROBES, discloses open yoked magnets having a ferromagnetic yoke, a plurality of opposed pairs of coaxial ferromagnetic field collimating structures and a plurality of opposed pairs of coaxial permanent magnets disposed between the yoke and the collimating structures.

U.S. patent application to Katznelson et al., Ser. No. 09/274,671 entitled HYBRID MAGNETIC APPARATUS FOR USE IN MEDICAL APPLICATIONS, discloses hybrid magnetic apparatus including, inter alia, permanent magnet assemblies combined with electromagnets.

SUMMARY OF THE INVENTION

The term MRI refers generally to all kinds of imaging and treatment techniques and devices that utilize magnetic resonance imaging (MRI), magnetic resonance therapy (MRT) and interventional magnetic resonance imaging (iMRI).

There is therefore provided, in accordance with a preferred embodiment of the present invention, a yoked magnetic structure for use in an MRI device to produce a predetermined volume of substantially uniform magnetic field in a region. The volume has an axis of symmetry parallel to the direction of the magnetic field. The magnetic structure includes an open ferromagnetic yoke having a first yoke surface and a second yoke surface being spaced apart along the axis of symmetry, in which both surfaces are shaped as a mirror images of each other, a first permanent magnet assembly that is attached to the first yoke surface and a second permanent magnet assembly that is attached to the second yoke surface. Each one of the permanent magnet assemblies comprises at least one annular permanent magnet, and at least one of the annular permanent magnets has a non-rectangular cross-section. In one preferred embodiment of the present invention the open ferromagnetic yoke is constructed for minimizing Eddy currents.

In another embodiment of the present invention, at least one of the annular permanent magnets is adapted for optimal accessibility to the region of substantially uniform magnetic field.

In yet another embodiment of the present invention, the first and/or the second annular permanent magnet may have a trapezoid cross-section, wherein the long base of said trapezoid cross-section is facing the first yoke surface and the short base of the trapezoid cross-section is facing the region of substantially uniform magnetic field.

Furthermore, the present invention also relates to a yoked magnetic structure for use in an MRI device to produce a predetermined volume of substantially uniform magnetic field in a region. The volume has an axis of symmetry parallel to the direction of the magnetic field. The magnetic structure includes: an open ferromagnetic yoke having a first yoke surface and a second yoke surface, in which the second yoke surface is shaped as a mirror image of the first yoke surface and is spaced apart from the first yoke surface along the axis of symmetry, a first permanent magnet assembly that is attached to the first yoke surface, a second permanent magnet assembly that is attached to the second yoke surface, in which each one of the permanent magnet assemblies comprise a combination of a magnetic field generator and a set of annular permanent magnets. In this arrangement, each set of annular permanent magnets are not arranged on the same plane. In a preferred embodiment of the present invention the open ferromagnetic yoke is constructed for minimizing Eddy currents. It is also preferred that each combination of the magnetic field generator and the set of annular permanent magnets is arranged to optimize the uniformity of the substantially uniform magnetic field. Each set of annular permanent magnets in another embodiment of the present invention may comprise calibration rings. In yet another embodiment, at least one of the magnetic field generators has non-homogeneous magnetic properties, and this non-homogeneous magnetic properties are used for compensation of the asymmetric magnetic properties of the open ferromagnetic yoke. Additionally, at least one of the magnetic field generators may be a round magnetic disc comprising a plurality of sectors, wherein at least one sector has different magnetic properties than other sectors. The non-homogeneous magnetic properties mentioned hereinabove may also result from non-homogeneous filling factor of the magnetic material. Another way for compensation of the asymmetric magnetic properties of the open ferromagnetic yoke is to locate the magnetic field generators not parallel to the yoke surfaces.

There is also provided, in accordance with another preferred embodiment of the present invention, a yoked magnetic structure for use in an MRI device to produce a predetermined volume of substantially uniform magnetic field in a region. The volume has an axis of symmetry parallel to the direction of the magnetic field. The magnetic structure includes an open ferromagnetic yoke having a first yoke surface and a second yoke surface, in which the second yoke surface is shaped as a mirror image of the first yoke surface and is spaced apart from the first yoke surface along the axis of symmetry; a first permanent magnet assembly that is attached to the first yoke surface, a second permanent magnet assembly that is attached to the second yoke surface, and a third permanent magnet assembly that is attached generally to the middle section of the connecting member of yoke, wherein the third permanent magnet assembly comprises at least one permanent magnet of a wedge shape. In a preferred embodiment of the present invention the open ferromagnetic yoke is constructed for minimizing Eddy currents. The third permanent magnet assembly is used for compensation of the asymmetric magnetic properties of the open ferromagnetic yoke.

BRIEF DESCRIPTION OF THE DRAWINGS

In order to understand the invention and see how it may be carried out in practice, several preferred embodiments will now be described, by way of non-limiting example only, with reference to the accompanying drawings, in which.

DETAILED DESCRIPTION OF THE INVENTION

The following description is provided, alongside all chapters of the present invention, so as to enable any person skilled in the art to make use of said invention and sets forth the best modes contemplated by the inventor of carrying out this invention. Various modifications, however, will remain apparent to those skilled in the art, since the generic principles of the present invention have been defined specifically to provide a permanent magnet assemblies for use in medical applications and particularly to permanent magnet assemblies having an open ferromagnetic yoke for use in magnetic resonance imaging (MRI), magnetic resonance therapy (MRT) and interventional magnetic resonance imaging (iMRI).

The present invention is based, in part, upon the realization that whole body imaging is not necessary for the performance of an interventional medical procedure on a patient in an MRI system. It has been realized that, in fact, a machine with a restricted field of view performs satisfactorily in such a setting and can be built in a more efficient and economical fashion than one built for accommodating a whole body. In accordance with this invention, permanent magnet assemblies, each formed from a plurality of annular concentric permanent magnets provide a volume of substantially uniform magnetic field extending from a central portion thereof.

Furthermore, in order to leave an open access to reach conveniently the part of the body on which the intervention is performed, the invention is concerned with assemblies that are compact and also do not incorporate ferromagnetic structures for the creation of return paths of the magnetic flux.

One object of the present invention is directed to improve accessibility to the patient's body part that is imaged and should be subject to an interventional medical procedure.

Figure 1:
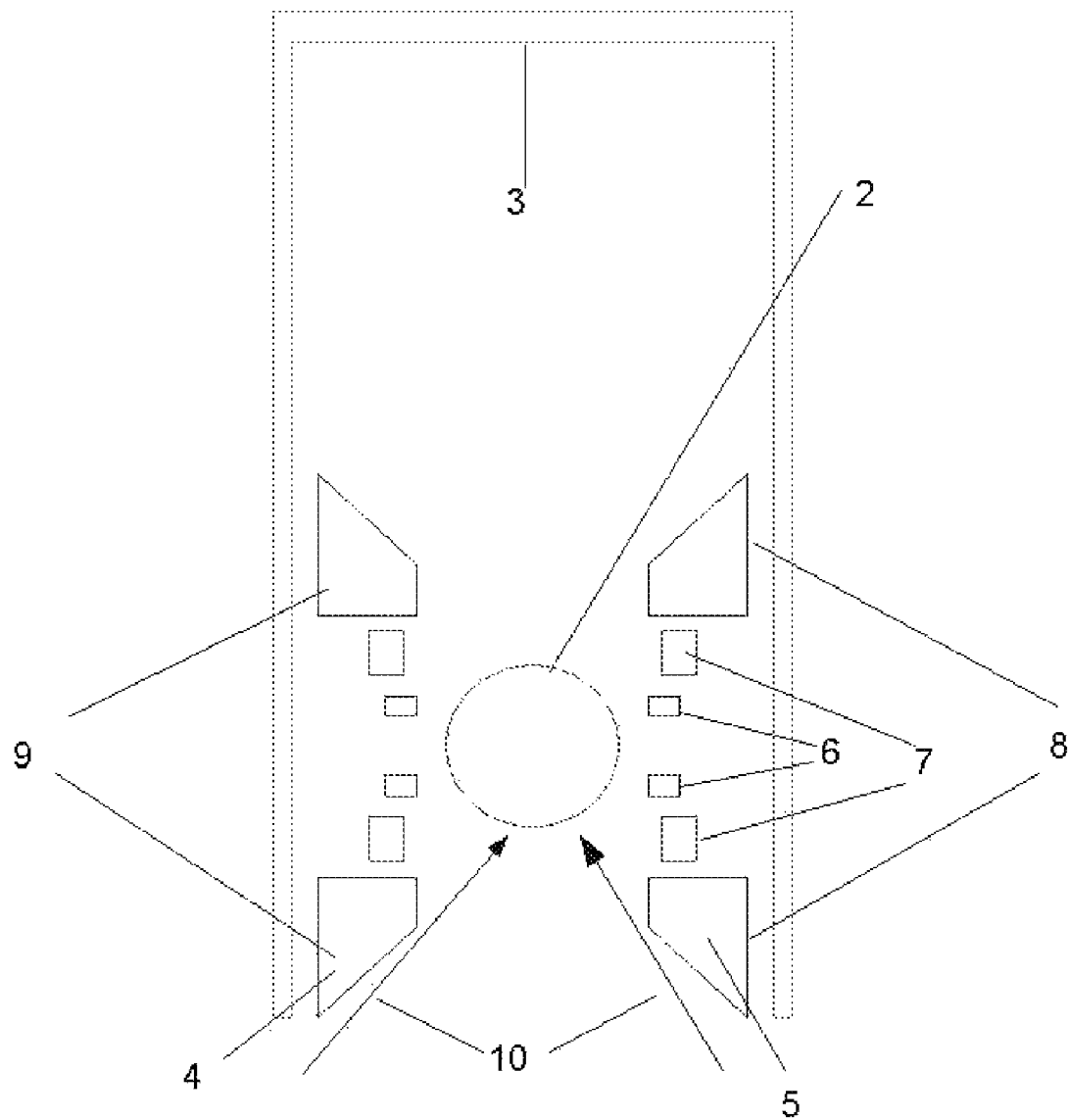
FIG. 1 is a schematic cross-sectional diagram of an open yoke permanent magnet assembly according to the present invention.

FIG. 1 demonstrates a yoked magnet assembly 1 that is constructed to produce a predetermined volume of substantially uniform magnetic field in a region that is defined as the Field Of View 2 (FOV) of the imaging system.

The yoked magnet assembly 1 consists of a ferromagnetic open yoke 3 and two permanent magnetic assemblies 4 and 5. The ferromagnetic open yoke 3 is preferably designed to have as small dimensions as possible and as small as possible eddy currents. Each one of permanent magnetic assemblies 4 and 5 is composed of a set of annular permanent magnets. The annular shape of each of the permanent magnet may comprise a round ring shape, or any closed polygon. Therefore, the term annular permanent magnet refers both to round ring permanent magnet as well as to closed polygon permanent magnet. Permanent magnet assembly 4 is composed of annular permanent magnets 6, 7 and 8. FIG. 1 demonstrates a cross-section view of these permanent magnets. It should be noted that although annular permanent magnets 6, 7 and 8 of FIG. 1 have rectangular cross section, other shapes of cross section are possible for achieving maximal efficiency of the magnetic material. Maximal efficiency means that a specified intensity of magnetic field is obtained using the minimal possible amount of magnetic material. It should also be noted that the relative position of annular permanent magnets 6,7 and 8 of permanent magnet assembly 4, and the annular permanent magnets of permanent magnet assembly 5 is chosen and calibrated in order to obtain the volume of substantially uniform magnetic field in the region of the Field Of View 2. It is also appreciated that while the cross-sections of annular permanent magnet 6 and annular permanent magnet 7 are of a rectangular shape, the cross-section of annular permanent magnet 8 is of a trapezoid shape. It is also appreciated that annular permanent magnet 9 of permanent magnet assembly 5 has also a trapezoid cross-section. The combination of the trapezoid cross-sections of annular permanent magnets 8 and 9, enables improved accessibility 10 to the patient's body part that is imaged, for any action including interventional medical procedure in case it is necessary. It should be noted that a rectangular cross-section of annular permanent magnets 8 and 9 would leave much less accessibility 10 for medical intervention to the region of Field Of View 2, both in terms of the distance to the patient, and angular accessibility and maneuvering capability of tools that are required during the medical procedure.

Figure 2:
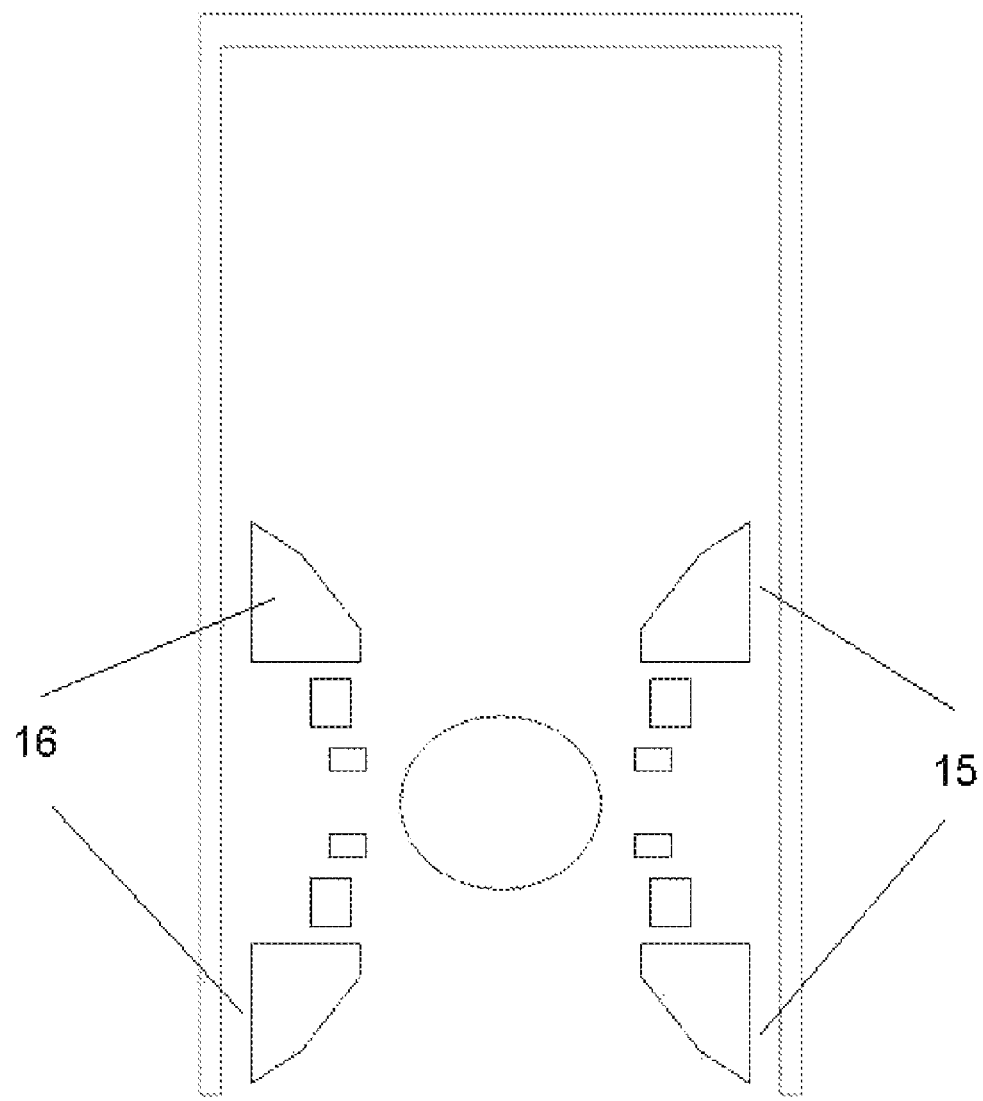
FIG. 2 is a schematic cross-sectional diagram of another open yoke permanent magnet assembly according to the present invention.

FIG. 2 demonstrated a similar yoked permanent magnet arrangement wherein the outer annular permanent magnets 15 and 16 have another cross-section shape rather than the trapezoid cross-section annular permanent magnets 8 and 9 of FIG. 1. However, the annular permanent magnets 15 and 16 of FIG. 2 enable an improved accessibility that is functionally similar to the improved accessibility demonstrated in FIG. 1. The accessibility to the patient as demonstrated in FIG. 2, both in term of distance to the patient and angular accessibility and maneuvering capability of tools, is significantly improved as compared to a magnet arrangement in which all annular permanent magnets are of rectangular cross-section.

Figure 3:
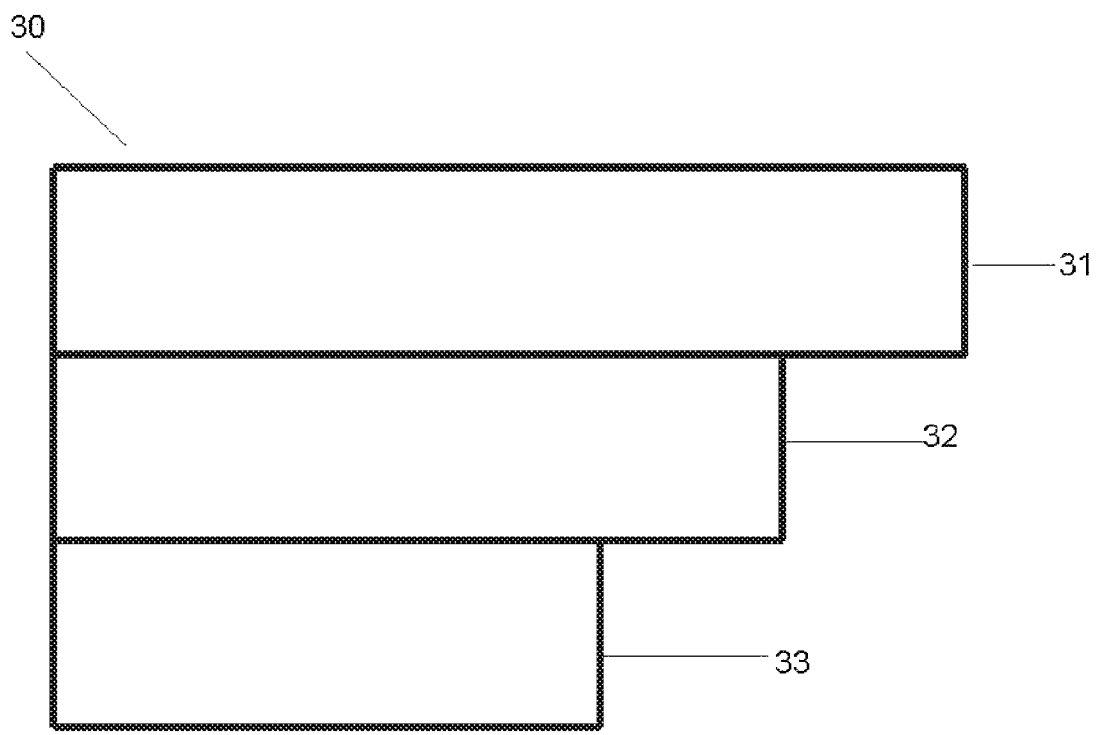
FIG. 3 is a schematic of a cross-section of a permanent magnet according to the present invention.

The trapezoid cross-section of annular permanent magnets 8 and 9 of FIG. 1 can be constructed from a set of rectangular annular permanent magnets as demonstrated in FIG. 3. Rectangular magnet 31 together with rectangular magnets 32 and 33 form an overall magnet 30 that assumes a trapezoid-like cross-section. A similar arrangement of sets of magnets is capable of composing more complex cross-sections such as demonstrated in FIG. 2.

Figure 4:
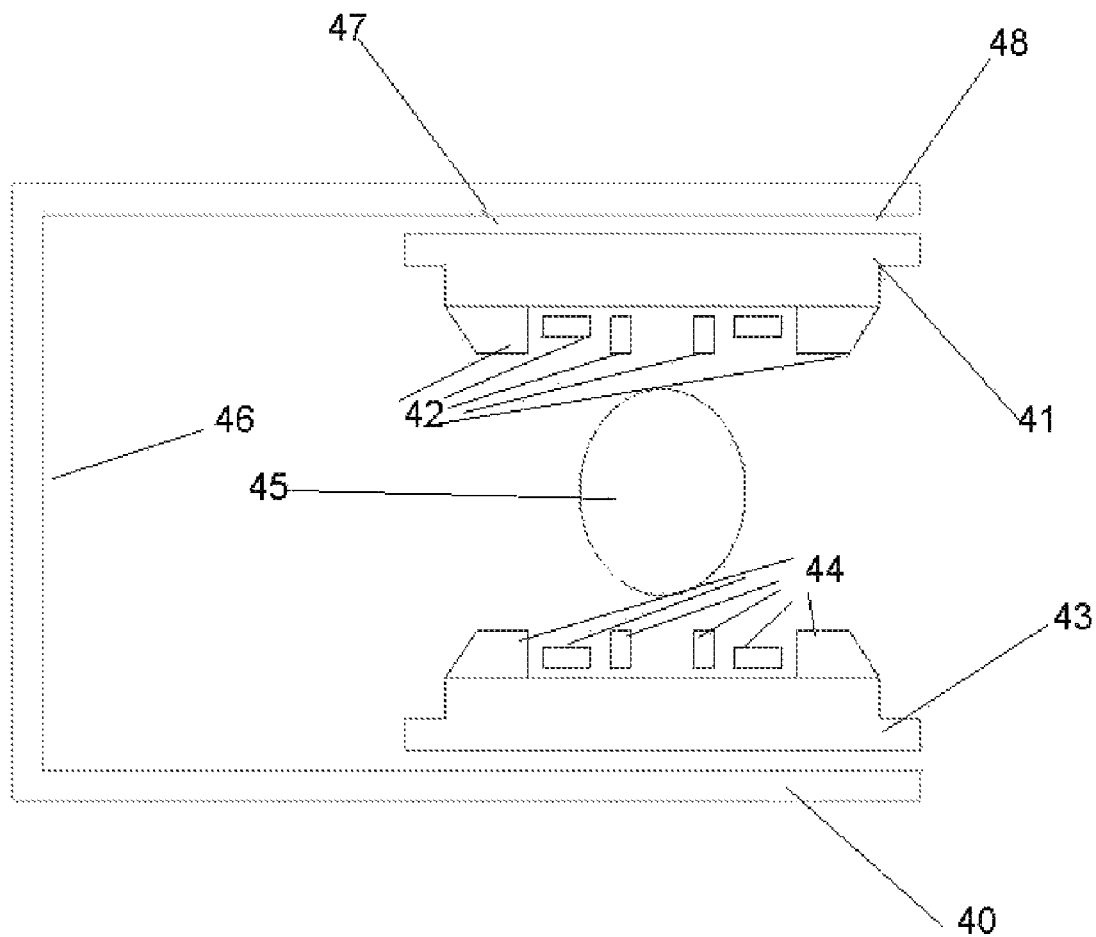
FIG. 4 is a schematic cross-sectional diagram of yet another open yoke permanent magnet assembly according to the present invention.

FIG. 4 illustrates another example of a yoked permanent magnet arrangement according to the present invention. This arrangement comprises a ferromagnetic yoke 40, magnetic field generators 41 and 43, and annular permanent magnets 42 and 44. The magnetic field is mainly generated by magnetic field generators 41 and 43 that are preferably discs or any other mechanical structure that provides high magnetic field from magnetic materials. Magnetic field generators 41 and 43 are also designed for maximum accessibility from the open side of the yoke. Annular permanent magnets 42 and 44 are used as calibration rings, and their main purpose is to compensate for non-homogeneity of the magnetic field that is generated by field generators 41 and 43 combined with the ferromagnetic yoke 40. The positioning of annular permanent magnets 42 and 44 is selected to achieve maximum possible uniformity of the magnetic field in the region of the Field Of View 45. As explained hereinabove, Field Of View 45 is a region of predetermined volume of substantially uniform magnetic field.

It is noted generally that an open yoke magnetic arrangement is not symmetrical by its nature. The two sides of the yoke that hold the magnetic field generators 41 and 43 are connected by a connecting member 46 to create a solid yoke. The distance of the connecting member 46 from the magnetic field generators 41 and 43 has an influence on the uniformity of the magnetic field, as the connecting member 46 attracts magnetic flux. If the yoke is big enough so that the connecting member 46 is far enough, its influence on the uniformity of the magnetic field is not significant. However, large yoke is more flexible due to the length of the yoke arm and therefore the yoke may vibrate during image capture. It is therefore desired by the Yoke designer to make the yoke as small as possible in order to reduce vibration to increase its mechanical resonance frequency.

Therefore, it is also another object of the present invention to enable a small yoke arrangement, which is preferable in some cases for reducing the size, the weight, the cost and overall clumsiness of the imaging system. In a small yoke, the distance of the connecting member 46 to the magnetic field generators is small, resulting in asymmetrical and non-uniform magnetic field. It is noted that the same analysis regarding the asymmetrical and non-uniform properties of the magnetic field apply also for the arrangements of FIG. 1 and FIG. 2. One possible solution that compensates this non-uniformity is a non-uniform gap between the magnetic field generators and the yoke surfaces. The gap at point 47, that is the near side to connecting member 46, may be set to be smaller than the gap at point 48, that is the far side from connecting member 46. The far side from the connecting member is actually the open side of the yoke from which the patient is accessible for medical treatment. Annular permanent magnets 42 and 44 may also comprise means for compensating the non-uniformity of the magnetic field in small yoke arrangements. These means may include non regular thickness or shape of the magnetic rings, non-uniform magnetic filling factor of magnetic material in different angular sectors of the magnetic rings, and other non-uniformities that are intentionally incorporated in the design of annual permanent magnets 42 and 44.

Non-uniformity may also be incorporated in the magnetic field generators 41 and 43. As explained hereinabove, field generators 41 and 43 may comprise a magnetic disc.

Figure 5:
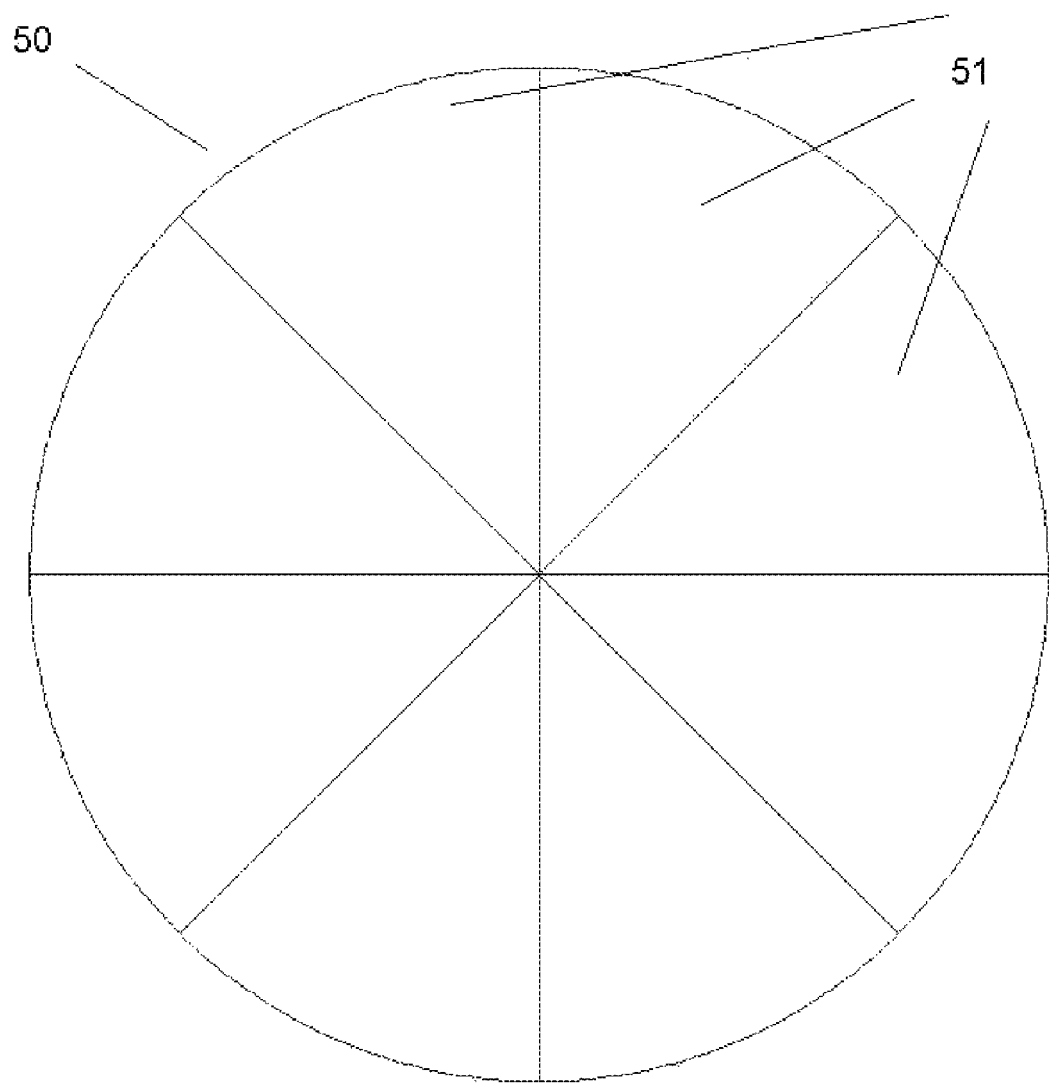
FIG. 5 is a schematic top view of a magnetic field generator according to the present invention.

FIG. 5 demonstrates a top view of a disc type magnetic field generator according to one preferred embodiment of the present invention. The disc 50 is composed of a magnetic material, and is divided to several sectors 51. Each sector of sectors 51 may have different magnetic properties. Therefore, disc 50 has a non-uniform magnetic field that is intentionally designed. The combination of such discs as magnetic field generators in combination with an open ferromagnetic yoke and annular permanent magnets as calibration rings, compose a magnetic structure that is relatively small and still have substantially uniform magnetic field in the Field Of View. The differences in the magnetic properties between sectors 51 may result from different magnetic filling factor of magnetic particles in different sectors.

Figure 6:
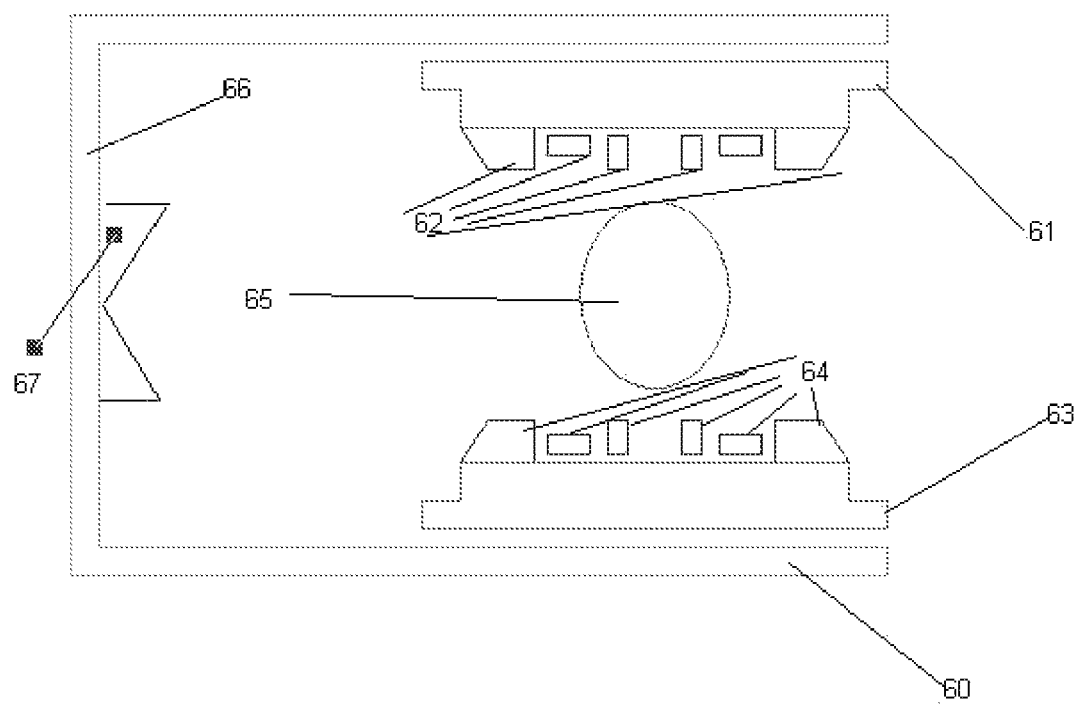
FIG. 6 is a schematic cross-sectional diagram of yet another open yoke permanent magnet assembly according to the present invention.

FIG. 6 demonstrates yet another preferred open yoke magnetic assembly according to the present invention. The magnetic assembly comprises similar elements to the embodiment of FIG. 4: an open ferromagnetic joke 60, magnetic field generators 61 and 63, annual permanent magnets 62 and 64 that are used as calibration rings. All these elements function in a similar way to the corresponding elements of FIG. 4. However, the magnetic assembly of FIG. 6 comprises also an additional magnet 67 that is attached to the connecting member 66 of open ferromagnetic yoke 60. Magnet 67 is preferably shaped as a wedge and its function is to compensate for the non-uniformity cased by the asymmetrical structure of the open ferromagnetic yoke 60. The structure of magnet 67 and its location is brought here by way of an example only and it is clear to anyone skilled in the art that many possible shapes and locations of magnet 67 may be realized for achieving the purpose of compensation the non-uniformity of the magnetic field.

It is noted that all means for compensating of the asymmetrical and non-uniform properties of the magnetic field as explained hereinabove with reference to the FIG. 4, FIG. 5 and FIG. 6, may be incorporated also to the arrangements of FIG. 1, FIG. 2 and FIG. 3. These means include the uneven gaps between the permanent magnet elements and the ferromagnetic yoke as demonstrated in reference to FIG. 4, the non uniform structure of the magnetic disc of FIG. 5, that may apply to each of the annular permanent magnet of FIG. 1, FIG. 2 and FIG. 3, and the additional permanent magnet 67 of FIG. 6.

It is also the object of the present invention to demonstrate means for reducing and practically preventing the difficulties caused by Eddy currents in the ferromagnetic yoke. It is noted that a full imaging system comprising the open yoke permanent magnet system of the present invention, comprises also other sources of electromagnetic fields. Operation of imaging process comprises switching on and off of electromagnetic fields. This effect may create Eddy currents in the ferromagnetic yoke as well as temporary changes in magnetic field due to hysteresis of the ferromagnetic material of the yoke. The eddy current phenomenon is also depending on the conductivity of the iron balk and geometry. There are few ways to overcome the difficulties caused by Eddy currents. One common way is to direct the current to flow in many very small loops or few very long loop, resulting in fast decay both in time and space. One preferable way to create many small loops is to assemble the yoke from many small pieces of ferromagnetic iron and glue them together. These small pieces may be covered by non conductive layer to avoid electric conductivity. One way to create very large loop is to use few layers of glued ferromagnetic iron sheets, comprising cuts that are designed for reducing the Eddy currents.

The above mentioned techniques for preventing the Eddy current phenomenon are presented by way of examples only. There are many additional methods that are known to anyone skilled in the field of magnetic systems for eliminating Eddy currents. All these methods may be applied for the ferromagnetic yoke of the present invention.

While the foregoing describes a preferred embodiment or embodiments of the present invention, it is to be understood that this description is made by way of example only and is not intended to limit the scope of the present invention. It is expected that alterations and further modifications, as well as other and further applications of the principles of the present invention will occur to others skilled in the art to which the invention relates and, while differing from the foregoing, remain within the spirit and scope of the invention as herein described and claimed. Where means-plus-function clauses are used in the claims such language is intended to cover the structures described herein as performing the recited functions and not only structural equivalents but equivalent structures as well. For the purposes of the present disclosure, two structures that perform the same function within an environment described above may be equivalent structures.

What is claimed is:

1. A yoked magnetic structure providing a predetermined volume of substantially uniform magnetic field in a region having an axis of symmetry parallel to the direction of said magnetic field, said yoked magnetic structure comprising:
   a. an open ferromagnetic yoke having a first yoke surface and a second yoke surface, said first and second yoke surfaces being spaced apart along said axis of symmetry, said first and second surfaces shaped as a mirror images of each other;
   b. a first permanent magnet assembly attached to said first yoke surface, said first permanent magnet assembly comprising a plurality of first annular permanent magnets; and,
   c. a second permanent magnet assembly attached to said second yoke surface, said second permanent magnet assembly comprising a plurality of second annular permanent magnets, the relative positions of said plurality of first annular permanent magnets and said plurality of second annular permanent magnets chosen so as to provide a volume of substantially uniform magnetic field;
   wherein at least one of the said annular permanent magnets has a non-rectangular cross -section.

2. The apparatus as recited in claim 1 wherein said open ferromagnetic yoke is constructed to minimize Eddy currents.

3. The apparatus as recited in claim 1 wherein at least one of said annular permanent magnets is adapted for optimal accessibility to said region of substantially uniform magnetic field.

4. The apparatus as recited in claim 1 wherein said first annular permanent magnet has a trapezoidal cross-section, wherein the long base of said trapezoid cross-section faces said first yoke surface and the short base of the trapezoid cross-section faces said region of substantially uniform magnetic field.

5. The apparatus as recited in claim 1 wherein at least one of said plurality of second annular permanent magnets has a trapezoidal cross-section, wherein the long base of said trapezoid cross-section faces said second yoke surface and the short base of the trapezoid cross-section faces said region of substantially uniform magnetic field.

6. A yoked magnetic structure providing a predetermined volume of substantially uniform magnetic field in a region, said volume having an axis of symmetry parallel to the direction of said magnetic field, said yoked magnetic structure comprising:
  a. an open ferromagnetic yoke having a first yoke surface and a second yoke surface; said second yoke surface shaped as a mirror image of said first yoke surface, said second yoke surface spaced apart from said first yoke surface along said axis of symmetry;
  b. a first magnetic field generator attached to said first yoke surface;
  c. a first set of annular permanent magnets;
  d. a second magnetic field generator attached to said second yoke surface; and
  e. a second set of annular permanent magnets;
wherein the surfaces of said first set of annular permanent magnets are not arranged on the same plane, and wherein the surfaces of said second set of annular permanent magnets are not arranged on the same plane.

7. The apparatus as recited in claim 6 wherein said open ferromagnetic yoke is constructed to minimize Eddy currents.

8. A yoked magnetic structure according to claim 6, wherein said first and said second sets of annular permanent magnets are arranged to optimize said uniformity of said substantially uniform magnetic field.

9. A yoked magnetic structure according to claim 6, wherein said first set of annular permanent magnets comprises calibration rings.

10. A yoked magnetic structure according to claim 6, wherein said second set of annular permanent magnets comprises calibration rings.

11. A yoked magnetic structure according to claim 6, wherein at least one of said first and said second magnetic field generators has non-homogeneous magnetic properties.

12. A yoked magnetic structure according to claim 11, wherein said non-homogeneous magnetic properties are used for compensation of the asymmetric magnetic properties of said open ferromagnetic yoke.

13. A yoked magnetic structure according to claim 11, wherein said non-homogeneous magnetic properties result from non-homogeneous filling factor of the magnetic material.

14. A yoked magnetic structure according to claim 6, wherein at least one of said first and said second magnetic field generators is a round magnetic disc comprising a plurality of sectors, wherein at least one sector has different magnetic properties than other sectors.

15. A yoked magnetic structure according to claim 6,
  wherein said first magnetic field generator is not parallel to said first yoke surface;
  wherein said second magnetic field generator is not parallel to said second yoke surface; and
  wherein the relative position of said magnetic field generators and said yoke surfaces is used for compensation of the asymmetric magnetic properties of said open ferromagnetic yoke.

* * * * *